US012678894B2

(12) United States Patent
Lasch et al.

(10) Patent No.: US 12,678,894 B2
(45) Date of Patent: Jul. 14, 2026

(54) METHOD FOR WELDING AN ATTACHMENT PIECE TO A SEMICONDUCTOR METALLISATION BY LASER WELDING

(71) Applicant: Siemens Aktiengesellschaft, Munich (DE)

(72) Inventors: Markus Lasch, Munich (DE); Friedrich Lupp, Gauting (DE); Stefan Stegmeier, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 813 days.

(21) Appl. No.: 17/927,910

(22) PCT Filed: Apr. 15, 2021

(86) PCT No.: PCT/EP2021/059770
§ 371 (c)(1),
(2) Date: Nov. 28, 2022

(87) PCT Pub. No.: WO2021/239321
PCT Pub. Date: Dec. 2, 2021

(65) Prior Publication Data
US 2023/0207516 A1    Jun. 29, 2023

(30) Foreign Application Priority Data

May 28, 2020    (DE) ..................... 10 2020 206 725.2

(51) Int. Cl.
*B23K 26/32*        (2014.01)
*B23K 103/00*       (2006.01)
(Continued)

(52) U.S. Cl.
CPC .......... *B23K 26/32* (2013.01); *B23K 2103/56* (2018.08); *H10W 72/07335* (2026.01); *H10W 72/352* (2026.01)

(58) Field of Classification Search
CPC ......... H01L 24/35; H01L 24/84; H01L 24/83; B23K 26/32; B23K 26/21; B23K 2103/56
See application file for complete search history.

(56) References Cited

U.S. PATENT DOCUMENTS

2004/0135237 A1*  7/2004  Funato ..............  H01L 23/49562
                                                            257/E23.044
2007/0172980 A1*  7/2007  Tanaka ....................  H01L 24/84
                                                            257/E23.044

(Continued)

FOREIGN PATENT DOCUMENTS

EP      1 811 557      7/2007  .............  H01L 21/60
JP      H11215652      8/1999  .............  H02G 3/16

OTHER PUBLICATIONS

Search Report for International Application No. PCT/EP2021/059770, 13 pages, Aug. 11, 2021.

(Continued)

*Primary Examiner* — Thien S Tran
(74) *Attorney, Agent, or Firm* — Slayden Grubert Beard PLLC

(57)            ABSTRACT

Various teachings of the present disclosure include a method for welding an attachment piece to a semiconductor metallization using laser welding. The method may include: arranging an attachment piece having a flat side with a thin point so the flat side faces the semiconductor metallization; and welding the flat side to the semiconductor metallization. The flat side rests against a flat side of the semiconductor metallization over an entire surface area of the flat side. The thin point is formed with a cup shape of the attachment (Continued)

piece. The cup shape is open in the direction away from the semiconductor metallization.

11 Claims, 2 Drawing Sheets

(51) Int. Cl.
H10W 72/00 (2026.01)
H10W 72/30 (2026.01)

(56) References Cited

U.S. PATENT DOCUMENTS

2009/0008775 A1    1/2009  Tanaka ........................... 257/737
2016/0381788 A1*  12/2016  Petitgas ................. H05K 3/328
                                                          174/250
2017/0312853 A1*  11/2017  Kabelitz .............. B23K 26/323

OTHER PUBLICATIONS

"Optical Properties of Liquid Metals at High Temperatures", Cavendish Laboratory, Cambridge, England, Philosophical Magazine, 20:168, 1115-1132, 2006.

* cited by examiner

METHOD FOR WELDING AN ATTACHMENT PIECE TO A SEMICONDUCTOR METALLISATION BY LASER WELDING

CROSS-REFERENCE TO RELATED APPLICATIONS

This application is a U.S. National Stage Application of International Application No. PCT/EP2021/059770 filed Apr. 15, 2021, which designates the United States of America, and claims priority to DE Application No. 10 2020 206 725.2 filed May 28, 2020, the contents of which are hereby incorporated by reference in their entirety.

TECHNICAL FIELD

The present disclosure relates to welding. Various embodiments of the teachings herein include methods and/or systems for welding an attachment piece to a semiconductor metallization by means of laser welding.

BACKGROUND

In electronics, in particular in power electronics, semiconductor components are used to switch currents and turn off potentials. Such semiconductor components comprise in particular semiconductor chips, insulated-gate bipolar transistors (IGBT transistors), metal oxide semiconductor field effect transistors (MOSFET), diodes and passive components, such as in particular resistors or capacitors.

To energize such semiconductor elements, it is necessary to provide electrical input and output wires, so that these semiconductor elements can be used in a circuit. To that end, construction and connection technologies are known which in particular comprise sintering, soldering, diffusion soldering, wire bonding and electrochemical deposition. However, in the case of such construction and connection technologies, a large number of process steps is always necessary. This large number of process steps on the one hand results in a lengthy process time, such as in particular in the case of diffusion soldering, or else entail subjecting the semiconductor components to a high degree of loading, in particular the application of pressure in the case of sintering. In addition, for external terminals, further connection technologies, in particular ultrasonic welding in the case of outwardly guided measurement or load terminals, are necessary.

These disadvantages of conventional construction or connection technologies are addressed by laser welding. However, there are also disadvantages linked to laser welding: Thus, in particular, laser light being coupled in leads to semiconductor components being subjected to high thermal loading, which can irreversibly destroy the semiconductor components. It is thus known, for instance, to weld copper attachment pieces to semiconductor metallizations by means of disk lasers, fiber lasers, or CO2 lasers.

A problem in this respect is that, in the case of the conventional laser wavelengths, the reflectivity of copper decreases as the temperature increases. At the start of laser welding, therefore, a high laser power output is necessary in order to couple the laser beam into the copper of the attachment piece at all. By contrast, as the temperature increases, the absorption of copper increases. When the copper has melted, the power output of the laser as a whole is suddenly transformed in the melt pool, with the result that the scope for processing between the copper starting to melt and the threshold intensity for deep welding being exceeded is very small. This circumstance consequently results in a high risk of exposing the semiconductor element to heat when an attachment piece comprising copper is welded to a semiconductor metallization of the semiconductor component in this way. In this connection, it is a problem in particular that typical metallization thicknesses of semiconductor metallizations are between 1 μm and 5 μm. In addition, very frequently there are insulation layers, typically between semiconductor metallizations and the semiconductor components, which insulation layers are formed with nitrides and/or oxides and can be thermally or thermomechanically destroyed easily. Up to now, a satisfactory solution to this problem has not been known.

SUMMARY

Teachings of the present disclosure include methods and/or systems for welding an attachment piece to a semiconductor metallization by means of laser welding. In particular, the teachings consist in a lower risk of destroying a semiconductor provided with the semiconductor metallization but provide high reliability. For example, some embodiments include a method for welding an attachment piece (30, 30') to a semiconductor metallization (20) by means of laser welding, in which method use is made of an attachment piece (30, 30') having a flat side with a thin point (40), wherein the flat side (35) is arranged facing the semiconductor metallization (20) and is welded to the semiconductor metallization (20), wherein the flat side (35) rests against a flat side of the semiconductor metallization (20) over its entire surface area, and wherein the thin point (40) is formed with a cup shape of the attachment piece (30, 30'), wherein the cup shape is open in the direction away from the semiconductor metallization (20).

In some embodiments, use is made of a semiconductor metallization (20) having a metallization thickness, and in which the welding to the semiconductor metallization (20) is performed in such a way that a welding-in depth during the laser welding is at most as deep as the metallization thickness, preferably at most 10 micrometers.

In some embodiments, the thin point (40) has a thin-point thickness, in particular perpendicular to the flat side (35), wherein the thin-point thickness is at most 100 micrometers, preferably at most 50 micrometers.

In some embodiments, a defined air gap is provided between the attachment piece (30, 30') and the semiconductor metallization (20) and welding is performed at least at the location of the air gap.

In some embodiments, the cup shape of the attachment piece (30') is covered.

In some embodiments, the cup shape of the attachment piece (30') holds a vacuum.

In some embodiments, an air gap is retained between the attachment piece (30, 30') and the semiconductor metallization (20).

In some embodiments, laser light (50) having a wavelength of at most 800 nanometers, having a wavelength of at most 600 nanometers, or having a wavelength of at most 550 nanometers, is used for the welding.

In some embodiments, the thin point (40) has a smallest width of at least 5 micrometers and/or at most 1000 micrometers in directions along the flat side (35).

In some embodiments, the attachment piece (30, 30') is formed with copper and/or solder and/or ceramic and/or polymer and/or forms a terminal contact.

In some embodiments, a melt pool (60) with a smallest width of the melt pool (60) in a direction along the flat side (35) is used for the welding, wherein the smallest width of the thin point (40) is at least twice, at least five times, or at least ten times the smallest width of the melt pool (60).

As another example, some embodiments include an electronics module having a semiconductor metallization (20) and having an attachment piece (30, 30'), in which the attachment piece (30, 30') is welded to the semiconductor metallization (20) by means of one or more of the methods described herein.

BRIEF DESCRIPTION OF THE DRAWINGS

The teachings of the present disclosure are explained in more detail below with reference to an exemplary embodiment illustrated in the drawings. In the figures.

DETAILED DESCRIPTION

Figure 1:
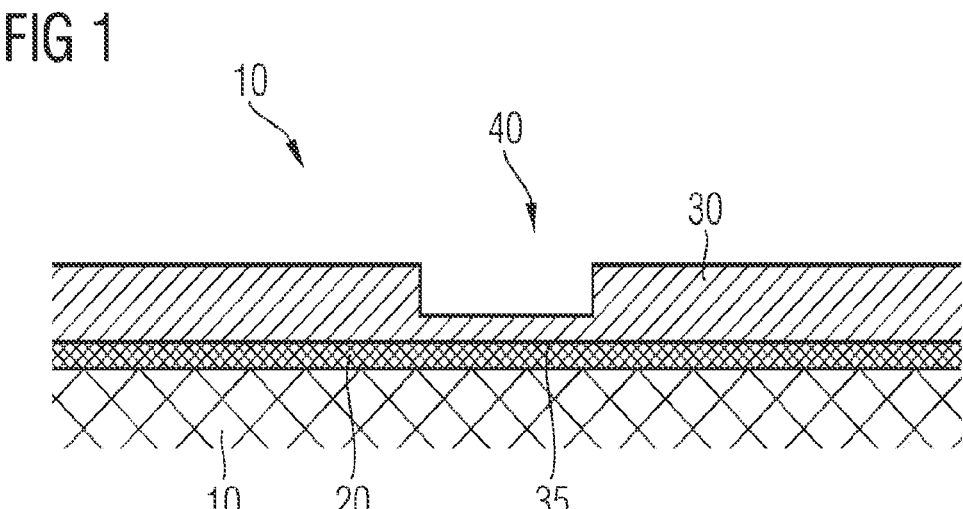
FIG. 1: schematically shows a longitudinal section through an arrangement of an attachment piece on a semiconductor metallization for the purpose of carrying out a method incorporating teachings of the present disclosure for welding the attachment piece to the semiconductor metallization.

In some embodiments, a method for welding an attachment piece to a semiconductor metallization by means of laser welding uses an attachment piece having a flat side with a thin point, wherein the flat side is arranged facing the semiconductor metallization and is welded to the semiconductor metallization. It should be understood that the thin point is a part of the attachment piece that is thinner than regions surrounding this thin point. Such a thin point may be formed in particular by a depression and/or indentation and/or niche and/or recess and/or cutout. The thin point is consequently located only in a sub-region of this flat side, i.e, the thin point does not take up the entire flat side along the planar extents of the flat side. Rather, the thin point forms a localized region of the flat side. In other words, the thin point is located in a sub-region of the flat side such that the attachment piece in this sub-region has a smaller thickness perpendicular to the flat side than in regions of the flat side that surround the sub-region, preferably in a region of the flat side that completely surrounds the sub-region.

The methods incorporating teachings of the present disclosure make it possible to achieve two important aims at the same time when laser welding an attachment piece to a semiconductor metallization: Firstly, by means of the thin point it is possible to achieve high preciseness of the welding depth, since the thin point means that there is only a small variability of the welding depth in comparison with thicker regions of the flat side. This is because the variability of the welding depth is dependent on the thickness of the attachment piece in the region of the welding zone. If the attachment piece has a particularly thin form in this region, as is the case for a thin point, it is possible to keep a fluctuation of the welding depth particularly low.

Since use is made of a flat side with a thin point that does not take up the entire flat side, the attachment piece can be formed with sufficient mechanical stability at the same time. That is to say, the local thin point does not cause any mechanical instabilities of the attachment piece over the entire planar extents of the flat side, but, in regions of the flat side not located at the thin point, the attachment piece can have a mechanical stability like that of conventional attachment pieces. Consequently, it is possible on the one hand to make use of a mechanically stable attachment piece, and at the same time, it is possible on the other hand to perform welding to a semiconductor component provided with the semiconductor metallization in a particularly reliable manner in terms of the process, i.e. with particularly small fluctuations of the welding depth and consequently with a particularly low risk of excessive exposure to temperature.

In some embodiments, use is made of a semiconductor metallization having a metallization thickness and the welding to the semiconductor metallization is performed in such a way that a welding-in depth during the laser welding, as measured from the flat side of the attachment piece, is at most as deep as the metallization thickness, at most 10 µm, at most 5 µm, or at most 1 µm. In this way, the welding-in depth during the laser welding is kept low such that exposure of the semiconductor component provided with the semiconductor metallization to heat is effectively ruled out. The attachment piece of which use is made and which has the thin point makes it possible to easily select such a low welding-in depth during the laser welding. Typically, metallization thicknesses are 10 µm or less.

In some embodiments, the thin point has a thin-point thickness, in particular a thin-point thickness perpendicular to the flat side, wherein the thin-point thickness is at most 100 µm, or at most 50 µm. In the case of thin points that are thin in this way, it is possible to realize a particularly low welding-in depth. This is because the levels of the fluctuations of the welding-in depth generally have a fixed relationship with the welding-in depth itself. In the case of small welding-in depths, consequently there are also particularly small fluctuations of the welding-in depth. In this way, the methods described herein make it possible to weld the attachment piece particularly reliably to the semiconductor metallization without it being the case that, as a consequence of the fluctuations of the welding depth, the welding depth itself becomes so great that the semiconductor component provided with the semiconductor metallization is destroyed.

In some embodiments, the thin point is formed with a cup shape of the attachment piece, wherein the cup shape is open in the direction away from the semiconductor metallization. In this respect, the cup shape may also be described as trough shape. In particular, such a cup shape is formed by a blind hole. By way of its opening, the cup shape faces away from the semiconductor metallization, i.e. its opening is located on a side of the attachment piece that faces away from the semiconductor metallization. In this way, the laser can radiate into the opening of the cup shape, with a bottom of the cup shape forming the thin point of the attachment piece. In this way, an easily manufacturable design of the attachment piece is provided. Such an attachment piece can be easily handled during the laser welding, since laser light can be radiated into the opening of the cup shape in a simple way.

In some embodiments, the cup shape of the attachment piece is covered. In other words, the cup shape of the attachment piece is closed with a cover of the attachment piece. The cover is suitably arranged on the opening of the cup shape, i.e, the cover is located on a side of the cup shape that faces away from the semiconductor metallization. In some embodiments, the laser can be easily directed onto the cover, with the result that the laser melts the cover. The molten material of the cover can enter the cup shape and wet the thin point of the cup shape. On account of the wetting of the thin point with the molten material of the cover, it is then likewise possible to melt the thin point and thus weld the attachment piece to the semiconductor metallization. In this refinement of the invention, particularly precise control of the welding-in depth can be achieved, and therefore particularly reliable manufacturing with a particularly low risk of exposing the semiconductor component provided with the semiconductor metallization to heat is possible.

In some embodiments, the cup shape of the attachment piece holds a vacuum, e.g, the covered cup shape of the attachment piece prevents air from entering the cup shape of the attachment piece. In this way, molten material of the cover can enter the cup shape of the attachment piece particularly easily, since air bubbles that could prevent the wetting of the thin point of the cup shape do not arise in this refinement. In some embodiments, the laser welding is performed in the vacuum. In some embodiments, multiple cup shapes that are spaced apart from one another by a specific distance may be provided in the attachment piece. In particular, it is possible to realize particularly narrow cup shapes, i.e. cup shapes having openings with particularly small cross sections, with a largest diameter of at most 50 micrometers, or with a largest diameter of at most 10 micrometers, with the result that particularly small welding depths, as measured from the thin point, can be achieved.

In some embodiments, an air gap is provided or retained between the attachment piece and the semiconductor metallization. Such an air gap makes it possible to minimize the forces acting on the semiconductor metallization. This is because shrinkage forces arising when the melt pool is cooling down can be absorbed by bending of the attachment piece, which is possible by virtue of the thin point that is present. Without an air gap, the attachment piece could be supported on the semiconductor metallization and shrinkage forces would apply a force to the boundary surface between the semiconductor metallization and a semiconductor component provided with the semiconductor metallization, and therefore in an extreme case the semiconductor component could be destroyed. In some embodiments, by contrast, such a consequence would be ruled out. In some embodiments, an air gap is provided by means of embossing the attachment piece. In some embodiments, however, other methods are also possible.

In some embodiments, laser light having a wavelength of at most 800 nm, having a wavelength of at most 600 nm, or having a wavelength of at most 550 nm, is used for the welding. In some embodiments, for the welding use is made of laser light in which the majority of the laser energy, at least 90 percent of the laser energy or at least 99.9 percent of the laser energy, is allotted to laser light having a wavelength of at most 800 nanometers, at most 600 nanometers or at most 550 nanometers.

There is no sudden decrease in the reflectivity at wavelengths below 600 nm, that is to say in the case of laser light having a shorter wavelength than laser light from disk lasers, fiber lasers or CO2 lasers. Rather, with shorter wavelengths in the blue or in the green wavelength range, heat-conduction welding, for instance of pure or ultra-pure copper, with sufficiently strong absorption of the laser power output is possible. In this way, it is possible to achieve high manufacturing accuracy and high process stability, since sudden deep welding can be avoided at these wavelengths. Consequently, it is possible to particularly reliably control and monitor the welding depth during the laser welding.

In some embodiments, use is made of the fact that the absorption behavior of liquid metals deviates from that of a solid (see e.g. "Optical Properties of Liquid Metals at High Temperatures" by JANE C. MILLER, Cavendish Laboratory, Cambridge, England, Philosophical Magazine, 20:168, 1115-1132). At a wavelength of 1030 nm, i.e. a photon energy of 1.2 eV, the optical absorption when transitioning from a solid which is at 200° C. to a molten surface considerably increases; at a wavelength of 515 nm, i.e. a photon energy of 2.41 ev, however, it decreases. This means that the input of energy of a laser beam into the workpiece during the melting can be kept low when use is made of a laser beam having a sufficiently small wavelength. The welding process proceeds with more control as a result.

In some embodiments, the thin point has a smallest width of at least 5 μm and/or at most 1000 μm in directions along the flat side. With these dimensions, the thin points are narrow enough that mechanical instability caused by the thin points does not necessarily result. At the same time, the width of the thin point is large enough that it remains possible to couple in laser light for laser welding.

In some embodiments, the attachment piece forms an attachment piece formed with copper and/or solder and/or ceramic and/or polymer. In some embodiments, the attachment piece forms an terminal contact. The materials mentioned above are accessible to laser welding and can be welded to semiconductor metallizations by means of laser welding.

In some embodiments, a melt pool is used for the welding, wherein the melt pool has a smallest width in a direction along the flat side, and wherein the smallest width of the thin point is at least twice, at least five times, or at least ten times the smallest width of the melt pool in the direction of the flat side. In this way, the thin point behaves thermally locally like a flat part with regard to the melt pool. That is to say, modifications owing to the surroundings of the thin point do not specifically need to be taken into account. In particular, with these geometric relationships, it is also possible to easily direct, in particular focus, laser light onto the thin point.

In the case of the arrangement shown in FIG. 1, a semiconductor element in the form of a semiconductor chip 10 is present, which has a flat side facing upward in FIG. 1. A semiconductor metallization 20 per se, which in a manner known per se extends along the flat side of the semiconductor chip 10 and thus likewise has an upwardly facing flat side, is applied to the flat side over its entire surface area. The semiconductor metallization 20 has a thickness of one micrometer perpendicularly with respect to the flat side of the semiconductor chip 10, but, in further exemplary embodiments which are not specifically illustrated, it can also have a greater thickness.

An attachment piece in the form of a current terminal 30 is arranged on the flat side of the semiconductor metallization 20. The current terminal 30 is formed with copper and has a flat side 35 which rests on the flat side of the semiconductor metallization 20. Correspondingly, the flat side 35 of the current terminal 30 faces downward in the illustration of FIG. 1.

The current terminal 30 has a thin point, which is formed on the current terminal 30 by means of a cup shape, which can also be described as trough shape. In this case, in FIG. 1 the cup shape has an upwardly open opening, with a bottom of the cup shape forming the thin point 40 of the cup shape. Here, the bottom of the cup shape, on its side facing the semiconductor metallization 20, terminates flush with the rest of the regions of the current terminal 30 over its entire surface area. In the case of the current terminal 30, the cup shape may simply be milled out in the form of a blind hole. In principle, other manufacturing methods for producing a cup shape are also conceivable.

Figure 2:
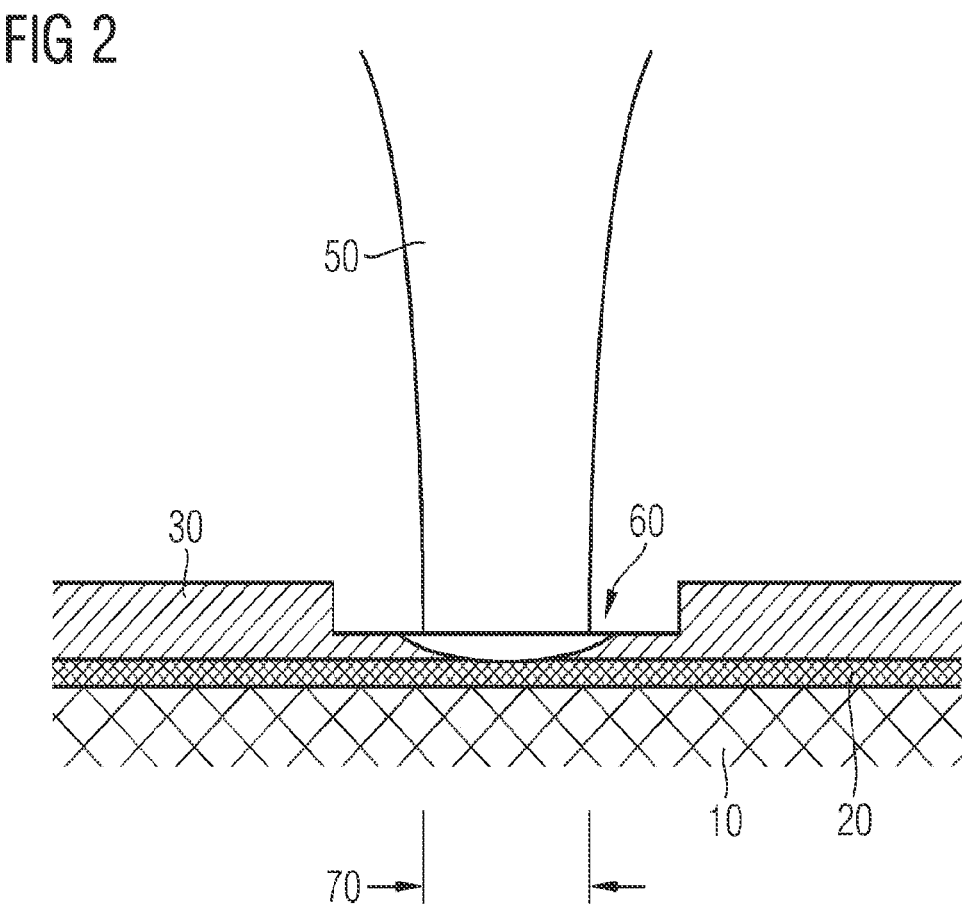
FIG. 2: schematically shows a longitudinal section through the arrangement according to FIG. 1 when the attachment piece is being welded to the semiconductor metallization by means of laser welding.

As illustrated in FIG. 2, a laser beam 50 of a blue or green laser, in the exemplary embodiment illustrated of a laser with light having a wavelength of up to 550 nm, is directed onto the thin point 40. This laser beam 50 melts the copper of the current terminal 30 in the region of the thin point 40, resulting in a melt pool 60. In this respect, the melt pool 60 has a circular cross section with widths 70, identical in all directions, along the planar directions of extent of the flat side 35, which is smaller than the widths (likewise identical in all directions) of the thin side 40 in the direction of the planar extents of the flat side 35 of the current terminal 30 by a factor of 2. In further exemplary embodiments that are not specifically illustrated, the ratio of the width of the melt pool 60 to the width of the thin point 40 may also form a quotient of one fifth or a quotient of one tenth.

By means of the laser welding illustrated in FIG. 2, it is then possible, owing to the small thickness of the thin point 40 of the current terminal 30, to reliably perform welding to the semiconductor metallization 20 without the welding depth, as measured from the flat side 35 of the current terminal 30, penetrating the semiconductor metallization 20 to a deeper extent than the semiconductor metallization 20 is thick. Consequently, in this exemplary embodiment, the semiconductor chip 10 is protected from destruction caused by the melt pool 60.

Figure 3:
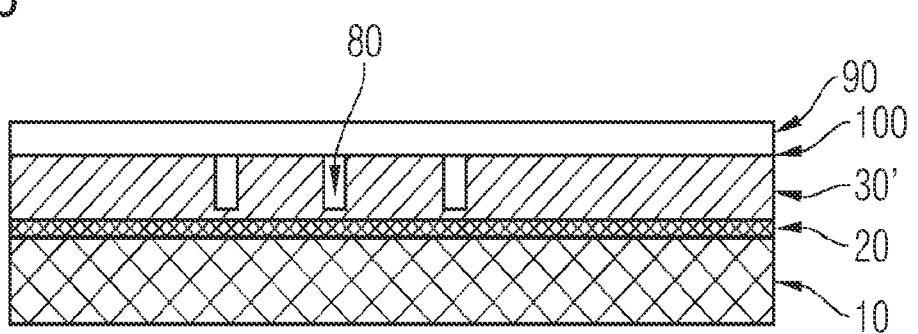
FIG. 3: schematically shows a longitudinal section through a an arrangement of an attachment piece on a semiconductor metallization incorporating teachings of the present disclosure.
Figure 4:
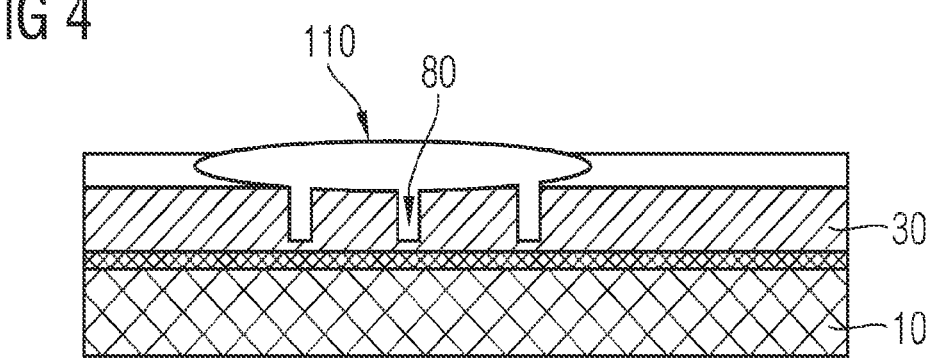
FIG. 4: schematically shows a longitudinal section through the arrangement according to FIG. 3 when the attachment piece is being welded to the semiconductor metallization in an earlier phase of the laser welding.
Figure 5:
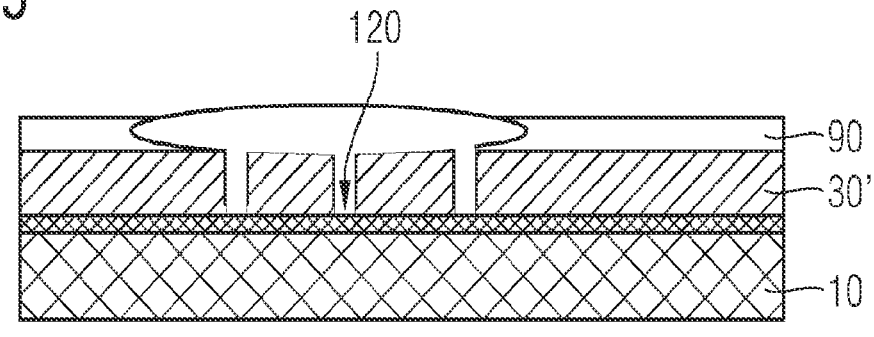
FIG. 5: schematically shows a longitudinal section through the arrangement according to FIGS. 3 and 4 when welding the attachment piece to the semiconductor metallization in a later phase of the laser welding compared to that phase of the laser welding shown in FIG. 4.

In the exemplary embodiment illustrated in FIGS. 3, 4 and 5, thin points likewise formed by cup shapes 80 are present on the current terminal 30'. By contrast with the exemplary embodiment described above, the cup shapes 80 are covered, i.e. a copper plate 90 in the form of a cover is welded to the current terminal 30' on that side of the current terminal 30' that faces away from the flat side 35 and said copper plate forms a flat part, which is arranged with planar directions of extent parallel to the flat side 35 of the current terminal 30' and covers the cup shapes 80.

In the exemplary embodiment illustrated in FIGS. 3, 4 and 5, the laser light 50 is then no longer coupled directly into the cup shapes 80, but rather the laser is directed onto the copper plate 90, specifically onto those regions of the copper plate 90 that cover the cup shapes 80. When the copper plate 90 is being melted, a weld pool 110 forms, which enters the cup shapes 80. In order to ensure the melt pool 110 readily enters the cup shapes 80, the copper plate 90 is welded to the current terminal 30' in a vacuum, with the result that the melt pool 110 does not incorporate any air bubbles when it flows into the cup shapes 80. In addition, in this exemplary embodiment, as in the exemplary embodiment described above, the laser welding is done in a vacuum. The melt pool 110 melts the bottoms 120 of the cup shapes 80, with the result that the current terminal 30' is welded to the semiconductor metallization 20. In the exemplary embodiment illustrated in FIGS. 3, 4 and 5, the cup shapes 80 have a smaller width, amounting to merely a fraction of the smallest width of the melt pool 110, than the exemplary embodiment described above. By means of the exemplary embodiment illustrated in FIGS. 3, 4 and 5, it is possible to set a particularly precisely controlled welding depth during the laser welding.

In further exemplary embodiments which are not specifically illustrated and in all other respects correspond to the exemplary embodiments described above, it is possible to provide, between the attachment piece 30, 30' and the semiconductor metallization 20, an air gap which ensures that shrinkage forces between the attachment piece 30, 30' and the semiconductor metallization 20 do not destroy the semiconductor chip 10.

The semiconductor chip 10 with the semiconductor metallization 20 and with the welded-on attachment piece 30, 30' forms an electronics module incorporating teachings of the present disclosure.

The invention claimed is:

1. A method for welding an attachment piece to a semiconductor metallization using laser welding, the method comprising:
    arranging the attachment piece having a cup shape having a flat base with a thin point so the flat base faces the semiconductor metallization and an opening of the cup is closed by a cover in a direction away from the semiconductor metallization; and
    welding the flat base to the semiconductor metallization by melting the cover with a laser so a resulting molten material from the cover wets the thin point;
    wherein the flat base rests against a flat side of the semiconductor metallization over an entire surface area of the flat base.

2. The method as claimed in claim 1, wherein:
    the semiconductor metallization has a metallization thickness; and
    welding the flat side to the semiconductor metallization results in a welding-in depth during the laser welding of at most as deep as the metallization thickness.

3. The method as claimed in claim 1, wherein:
    the thin point has a thin-point thickness perpendicular to the flat side of at most 100 micrometers.

4. The method as claimed in claim 1, wherein:
    a defined air gap is provided between the attachment piece and the semiconductor metallization; and
    welding the flat side is performed at the defined air gap.

5. The method as claimed in claim 1, wherein the cup shape of the attachment piece holds a vacuum.

6. The method as claimed in claim 1, wherein an air gap is retained between the attachment piece and the semiconductor metallization.

7. The method as claimed in claim 1, wherein welding the flat side includes using a laser light with a wavelength of at most 800 nanometers.

8. The method as claimed in claim 1, wherein the thin point has a smallest width of at least 5 micrometers and at most 1000 micrometers in directions along the flat side.

9. The method as claimed in claim 1, wherein the attachment piece comprises copper and/or solder and/or ceramic and/or polymer and/or forms a terminal contact.

10. The method as claimed in claim 1, further comprising forming a melt pool with a smallest width in a direction along the flat side for welding the flat side;
    wherein a smallest width of the thin point is at least twice the smallest width of the melt pool.

11. An electronics module comprising:
    a semiconductor metallization; and

9

10 an attachment piece welded to the semiconductor metal-
lization;
wherein the attachment piece has a cup shape with a flat
base having a thin point facing the semiconductor
metallization and an opening of the cup in a direction
away from the semiconductor metallization; and
the flat base is welded to the semiconductor metallization;
the flat base rests against a flat side of the semiconductor
metallization over an entire surface area of the flat base.

\* \* \* \* \*